(12) United States Patent
Vreman et al.

(10) Patent No.: US 9,420,700 B2
(45) Date of Patent: Aug. 16, 2016

(54) INCLINED PHOTONIC CHIP PACKAGE FOR INTEGRATED OPTICAL TRANSCEIVERS AND OPTICAL TOUCHSCREEN ASSEMBLIES

(71) Applicant: Intel Corporation, Santa Clara, CA (US)

(72) Inventors: Gerrit J Vreman, Folsom, CA (US); Tom E Pearson, Beaverton, OR (US); Peter L Chang, Portland, OR (US); Jia-Hung Tseng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/882,133

(22) Filed: Oct. 13, 2015

(65) Prior Publication Data

US 2016/0088740 A1   Mar. 24, 2016

Related U.S. Application Data

(62) Division of application No. 14/141,026, filed on Dec. 26, 2013, now Pat. No. 9,263,621.

(51) Int. Cl.
*H01L 21/00* (2006.01)
*H05K 3/30* (2006.01)
(Continued)

(52) U.S. Cl.
CPC ............... *H05K 3/30* (2013.01); *G06F 3/0421* (2013.01); *H01L 24/97* (2013.01); *H01L 31/02005* (2013.01); *H01L 31/12* (2013.01); *H01L 31/125* (2013.01); *H01L 31/18* (2013.01); *G06F 2203/04109* (2013.01); *H01L 21/561* (2013.01); *H01L 21/568* (2013.01); *H01L 23/49541* (2013.01); *H01L 23/49551* (2013.01); *H01L 24/32* (2013.01); *H01L 24/48* (2013.01);
(Continued)

(58) Field of Classification Search
CPC ........... H01L 2225/06582; H01L 2224/04105; H01L 23/49805; H01L 23/3114
USPC .......................................................... 438/25
See application file for complete search history.

(56) References Cited

U.S. PATENT DOCUMENTS 6,749,345 B1   6/2004  Gee et al.

OTHER PUBLICATIONS

Non-Final Office Action mailed Jun. 8, 2015, for U.S. Appl. No. 14/141,026.
(Continued)

*Primary Examiner* — Elias M Ullah
(74) *Attorney, Agent, or Firm* — Green, Howard & Mughal LLP (57) ABSTRACT

An optical touchscreen assembly may employ a photonic chip packaged with a chip surface at an angle inclined between horizontal and vertical orientations. An inclined paddle sawn flat no-leads (IPSFN) package may be affixed to a cover glass surface along a perimeter of a display. IPSFN packages may incorporate a photo-emitter chip and a photo-detector chip that may be inclined for a desired angle of incidence relative to the cover glass. A CMOS integrated optical transceiver package may include inclined photonic chips and a non-inclined CMOS chip having at least one of a photo-emitter driver, or a photo-detector TIA and/or ADC. A chip package lead frame may include cantilevered paddle tabs amenable to controlled deflection during package assembly. An inclined packaging assembly method may include attaching a chip to a lead frame paddle and form pressing the lead frame to incline the chip to a desired angle before encapsulation.

20 Claims, 9 Drawing Sheets

(51) Int. Cl.
  H01L 31/18    (2006.01)
  G06F 3/042    (2006.01)
  H01L 31/12    (2006.01)
  H01L 31/02    (2006.01)
  H01L 23/495     (2006.01)
  H01L 21/56      (2006.01)
  H01L 23/00      (2006.01)

(52) U.S. Cl.
  CPC ............... *H01L24/73* (2013.01); *H01L 24/92* (2013.01); *H01L 2224/32245* (2013.01); *H01L 2224/48091* (2013.01); *H01L 2224/48137* (2013.01); *H01L 2224/48247* (2013.01); *H01L 2224/48257* (2013.01); *H01L 2224/73265* (2013.01); *H01L 2224/92247* (2013.01); *H01L 2224/97* (2013.01); *H01L 2924/12041* (2013.01); *H01L 2924/12042* (2013.01); *H01L 2924/181* (2013.01); *Y10T 29/49002* (2015.01); *Y10T 29/4913* (2015.01)

(56) References Cited

OTHER PUBLICATIONS

Notice of Allowance mailed Oct. 7, 2015, for U.S. Appl. No. 14/141,026.

INCLINED PHOTONIC CHIP PACKAGE FOR
INTEGRATED OPTICAL TRANSCEIVERS
AND OPTICAL TOUCHSCREEN
ASSEMBLIES

CLAIM OF PRIORITY

This United States Patent Application is a divisional application of U.S. patent application Ser. No. 14/141,026 titled "INCLINED PHOTONIC CHIP PACKAGE FOR INTEGRATED OPTICAL TRANSCEIVERS & OPTICAL TOUCHSCREEN ASSEMBLIES," filed 26 Dec. 2013, the entire contents of which are incorporated herein by reference for all purposes.

TECHNICAL FIELD

Embodiments of the invention are generally related to photonic chip packages, and more particularly to optical transceivers and optical touchscreen assemblies.

BACKGROUND

Many electronic devices employ an electronic visual display. Touchscreen displays have become popular over the last decade, particularly in the context of mobile devices. Capacitive and resistive touch screen technologies have been widely deployed but have limitations, for example with respect to electrical properties of the touch input, optical clarity, and multi-touch capability.

Optical touchscreen are a promising technology that has many advantages. Optical touch screens may use FTIR (frustrated total internal reflection) where light (e.g., from an LED) is injected into a glass or acrylic glass substrate. Current state of the art LED packaging places an LED chip either at horizontal (0°) or vertical (90°) position within a package. Vertical placement requires additional space on the edge of the glass and interfacing of the package to the glass is difficult. Horizontal placement necessitates a light diffuser on top of the glass to scatter emitted light into shallow incident angles. A light diffuser is generally incompatible with "glass-to-edge" displays and results in low injection efficiency/higher optical power demands.

State of the art optical touch screen displays therefore currently require a 7 mm to 12 mm wide boarder around the edge of a display to implement optical touch technology. While this may not be an issue with larger displays, this is a significant barrier for smaller touch displays, for example of the type that may be employed in smart phones, tablets, and ultrabooks, etc., which benefit most from glass-to-edge displays, thin designs, low power, and low cost.

Miniaturization of optical touch screen technology generally entails integration of optical transceivers, integrated circuits, board & system design, and low-cost packaging heretofore unavailable.

Manufacturable methods, photonic device packaging architectures, and assemblies addressing the limitations of existing vertical and horizontal photonic chip packaging are therefore advantageous, and may prove a critical path in advanced optical touchscreen technology.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY
EMBODIMENTS

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings and are not intended to restrict the application of claimed subject matter. Therefore, the following detailed description is not to be taken in a limiting sense and the scope of claimed subject matter is defined solely by the appended claims and their equivalents.

In the following description, numerous details are set forth, however, it will be apparent to one skilled in the art, that embodiments may be practiced without these specific details. In some instances, well-known methods and devices are shown in block diagram form, rather than in detail, to avoid obscuring inventive aspects of the exemplary embodiments. References throughout this specification to "an embodiment" or "one embodiment" mean that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the first and second embodiments are not mutually exclusive.

As used in the description of the exemplary embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

As described in greater detail below, an optical touchscreen assembly achieves efficient backside incidence through incorporation of photonic chips packaged with the chip surface at an angle inclined between horizontal and vertical orientations. In embodiments, an inclined paddle sawn flat no-leads (IPSFN) package is affixed to a cover glass back surface along a perimeter of a display also affixed to the cover glass back surface. The IPSFN package may in exemplary optical transceiver embodiments incorporate both a photo-emitter chip (e.g., LED) and photo-detector chip, both of which are inclined for a proper angle of incidence relative to the cover glass. In further embodiments, a CMOS integrated optical transceiver package includes inclined photo-emitter and/or photo-detector chips and a non-inclined CMOS chip including at least one of an emitter driver, or a detector analog-to-digital convertor (ADC) coupled to one or more of the photonic chips within the package. In embodiments, a package lead frame includes cantilevered paddle tabs amenable to controlled deflection into inclined paddles during package assembly. In embodiments, a photonic package assembly method includes attaching a photonic chip to a lead frame paddle and form-pressing the lead frame to incline the photonic chip to a desired angle before encapsulation.

Figure 1:
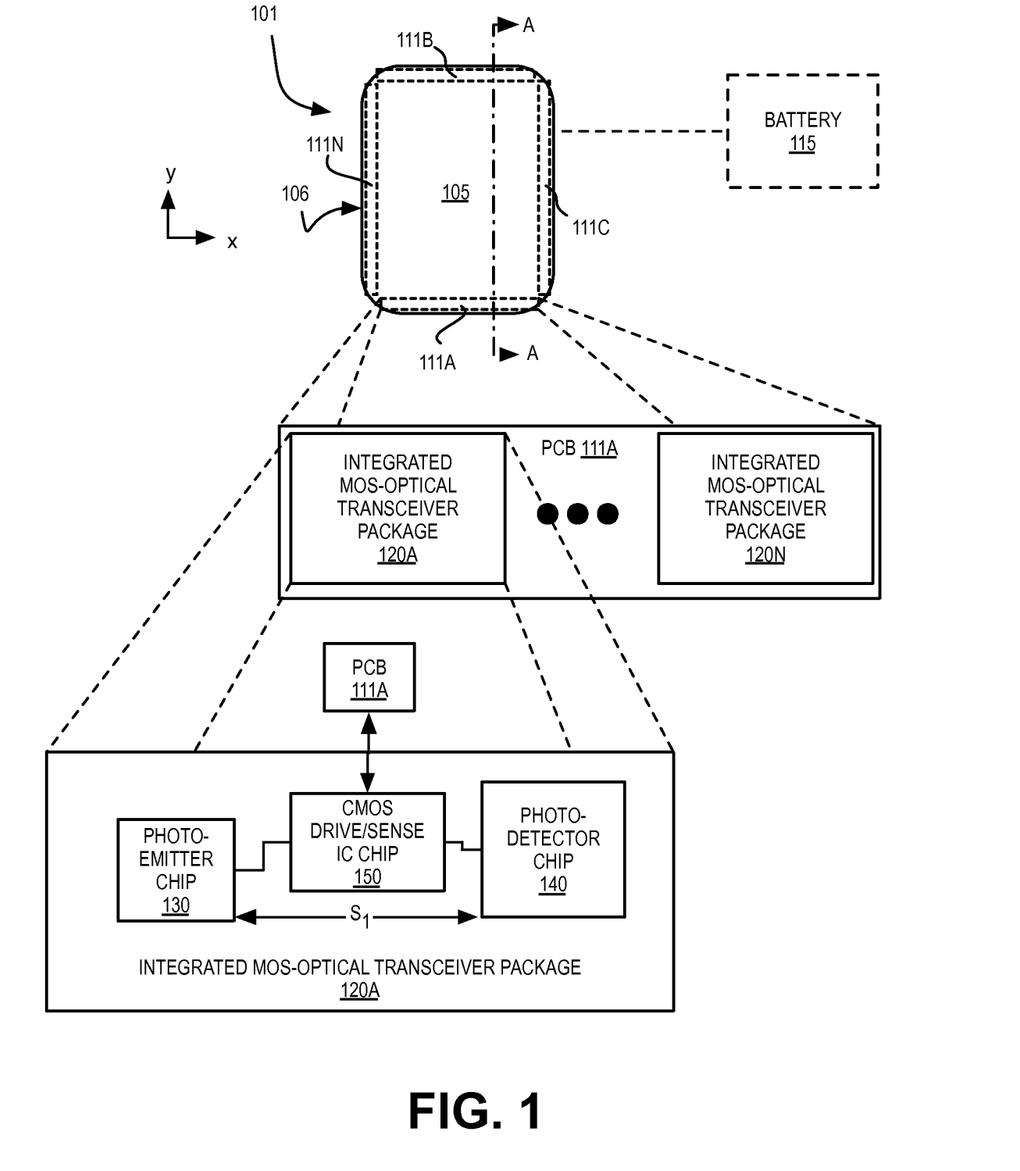
FIG. 1 illustrates an optical touchscreen assembly, in accordance with an embodiment.

FIG. 1 illustrates an optical touchscreen assembly 101, in accordance with an embodiment. Touchscreen assembly 101 may be further assembled into any stationary or portable electronic device configured for electronic data display and operator input data sensing/processing, or the like. For example, a mobile computing platform, such as, but not limited to a tablet, a smart phone, laptop computer, an ultrabook computer, a game console, etc., may include optical touchscreen assembly 101, and a battery 115 to power to touchscreen assembly 101. A stationary electronic device, such as, but not limited to, a consumer television, and a commercial point-of-sale kiosk, may similarly include optical touchscreen assembly 101 powered by a wall plug or other stationary power source.

Optical touchscreen assembly 101 includes a cover glass 105 having a perimeter edge 106. Cover glass thickness may vary with device application, with an exemplary thickness being approximately 1 mm. One or more printed circuit board (PCB) 111A is disposed against a back surface of cover glass 105 adjacent to perimeter edge 106. In the exemplary embodiment, a plurality of PCBs 111A, 111B, 111C, 111N form a perimeter at least partially enclosing a center region of cover glass 105. Each PCB 111A-111N hosts one or more backside-incident optical touchscreen component. One such component is an optical transceiver package having photo-emission and photo-detection functionality at one or more electromagnetic wavelength, such as, but not limited to, the (near) IR wavelength band.

In an exemplary embodiment, PCB 111A includes one or more integrated MOS-optical transceiver package 120A, and in the illustrated embodiment PCB 111A includes a plurality of integrated MOS-optical transceiver packages 120A-120N. As further illustrated in FIG. 1, integrated MOS-optical transceiver package 120A includes CMOS drive and/or sense integrated circuit (IC) chip 150, which is electrically coupled to photo-emitter chip 130 and/or photo-detector chip 140. Photo-emitter chip 130 may include any light emitting diode (LED) or laser diode, for example. Photo-detector chip 130 may include any p-i-n detector or metal-semi-conductor-metal (MSN) detector, for example. CMOS IC chip 150 is electrically coupled to PCB 111A, and each of the photonic chips 130, 140 may include at least one terminal coupled to PCB 111A. As described in further detail below, one or more intra-package electrical connections between chips 130, 140, and 150 may be present in addition to the package-level PCB connections. In advantageous embodiments, the separate photonic chips 130 and 140 employed in transceiver package 120A may be spaced apart by a spacing $S_1$ of 3-5 millimeters (mm), or more. CMOS IC chip 150 is disposed within spacing $S_1$.

In the exemplary embodiment where both photo-emitter and photo-detector functionality is integrated at the package level, CMOS IC chip 150 advantageously includes at least one of CMOS photo-emitter drive circuitry and CMOS photo-detector transimpedance amplifier (TIA) and/or analog-to-digital conversion (ADC) circuitry. Integrating the CMOS drive/sense IC chip 150 with photo-detector chip 140 at the package level advantageously couples the photo-detector to the CMOS TIA/ADC circuitry via short interconnects, reducing parasitic capacitance and improving signal-to-noise ratio (SNR) of the detection circuitry relative to assembly architectures relying on PCB-level integration. Once the optical signal is converted into electrical signal within a short distance, the circuits for processing the electrical signals can be located further away, offering more flexibility in the system design for specific form factor.

Figure 2A:
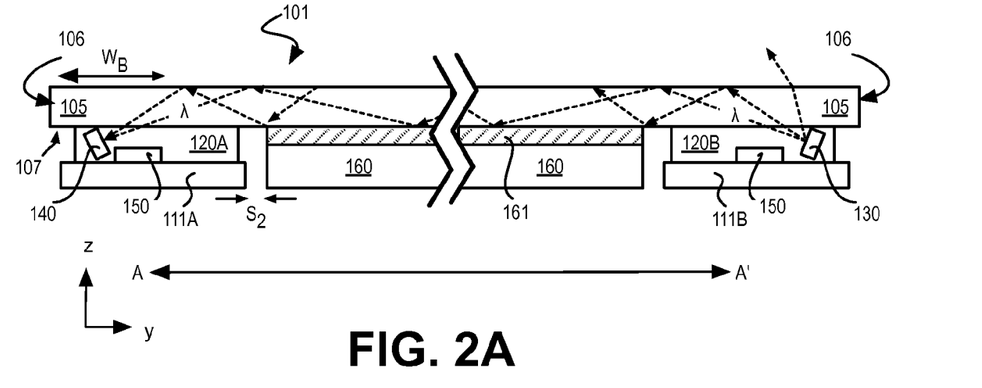
FIG. 2A is a cross-sectional view of the optical touchscreen assembly depicted in FIG. 1 along the A-A' line shown in FIG. 1, in accordance with an embodiment.

FIG. 2A is a cross-sectional view of optical touchscreen assembly 101 along the A-A' line shown in FIG. 1, in accordance with an embodiment. As shown, display 160 is affixed to cover glass back surface 107 within a center region of glass 105. Display 160 is affixed to cover glass 105 with an intervening adhesive 161 and may employ any display technology, such as, but not limited to, liquid crystal display (LCD). Adjacent to least one edge of display 160 is a photonic chip package having a top package surface substantially parallel with the display glass back surface 107. In the exemplary embodiment, the photonic chip package is MOS-optical transceiver package 120A, but the same assembly principles and architecture may be utilized for any photonic chip package having a photonic chip inclined for backside incidence.

As further shown in FIG. 2A, a top surface of transceiver package 120A is abutting cover glass back surface 107 while a bottom surface of transceiver package 120A is solder bonded (e.g., surface mounted) to PCB 111A. Transceiver package 120B is likewise disposed between cover glass 105 and PCB 111B near edge 106 on an opposite side of display 160. The plurality of the optical transceiver packages 120A-120N may therefore form a perimeter about display 160 and each package has a package top surface substantially parallel with the cover glass back surface 107.

In embodiments, a photonic chip package includes at least one of a photo-emitter chip or photo-detector chip inclined relative to the first surface of an adjacent cover glass. As shown in FIG. 2A, for example, photo-emitter 130 is inclined from a horizontal (e.g., $\Delta z=0$) plane defined by cover glass back surface 107. With an appropriate incline angle between the horizontal and vertical, photo-emitter chip 130 may emit radiation including a center wavelength $\lambda$ (e.g., 1210 nm) over a solid angle range of backside incidences appropriate for efficient total internal reflection (TIR) within cover glass 105. Likewise, as illustrated for transceiver package 120B, a similarly inclined photo-detector chip 140 receives radiation including center wavelength $\lambda$ transmitted through cover glass 105 and exiting over essentially the same range of incidence angles.

Figure 2B:
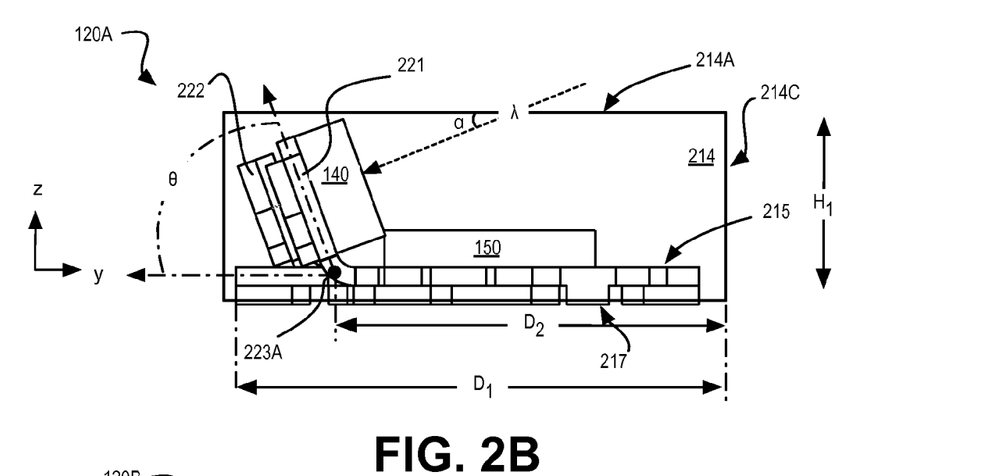
FIGS. 2B and 2C are expanded cross-sectional views of the integrated optical transceiver package depicted in FIG. 2A, in accordance with embodiments.
Figure 2C:
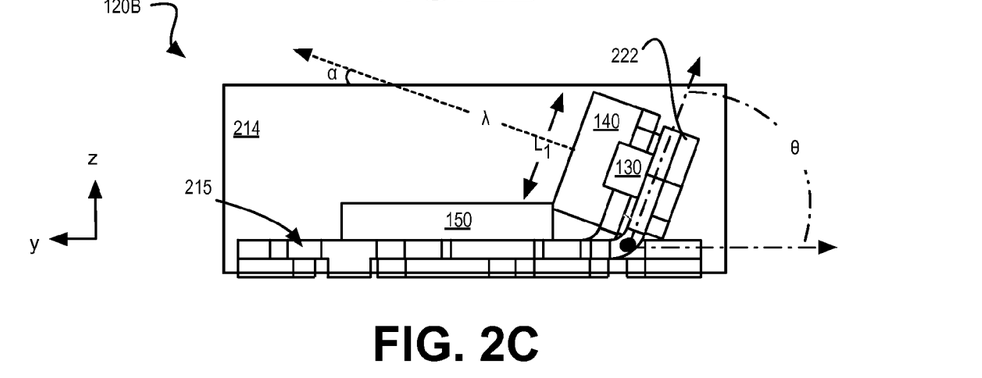

FIGS. 2B and 2C are expanded cross-sectional views of the integrated MOS-optical transceiver package 120A, in accordance with embodiments. Transceiver package 120A includes a solid encapsulant 214 with a top package surface 214A forming a plane substantially parallel with a contact pad bonding surface 217. Encapsulant 214 may be any material transmissive within the optical transceiver bandwidth, such as, but not limited to epoxy formulations. With top package surface 214A abutted against cover glass back surface 107, contact pad bonding surface 217 is essentially parallel to cover glass back surface 107. Transceiver package 120A further includes a lead frame 215 having inclined lead frame paddles 221, 222. FIG. 2B illustrates photo-detector chip 140 attached to inclined lead frame paddle 221. FIG. 2C illustrates photo-emitter chip 130 attached to inclined lead frame paddle 222. Inclined paddles 221, 222 are inclined between a horizontal and vertical orientation to be non-parallel to top package surface 214A, and therefore non-parallel to contact pad bonding surface 217. In advantageous embodiments, inclined paddles 221, 222 have an incline angle $\theta$ between 65° and 85°, and more advantageously between 70° and 80° with 75° offering maximum efficiency for a cover glass of typical thickness (e.g., <1 mm) and over the refractive index range typical for encapsulant 214 and cover glass 105 (e.g., n~1.5). Photonic emission angle $\alpha$ is therefore a grazing angle in the range of 15°-35° relative to cover glass back surface 107. With photonic chips having this orientation, cover glass light injection efficiency may be 80% or more. Notably, direct bonding of a photonic chip (i.e., non-inclined) results in substantially normal angles of incidence, which may yield only 10-15% cover glass injection efficiency.

In further reference to FIG. 2B, transceiver chip package 120 has a width $D_1$ and z-height $H_1$, which is each a function of the paddle incline angle and photonic chip dimension. Width $D_1$ may also be a function of lateral dimensions of CMOS chip 150. As shown in FIG. 2C, package z-height $H_1$ is limited by the larger lateral dimension $L_1$ of optical-detector chip 140. To minimize package width $D_1$, inclined paddles 221, 222 are set back from package edge 214C, which is adjacent to display 160. In one embodiment, distance $D_2$ between package edge 214C and the paddle deflection vertex 223A is smaller than package width $D_1$ by less than the product of lateral dimension $L_1$ and $\cos\theta$. For one exemplary integrated MOS optical transceiver package, $D_1$ is less than 3 mm. As further depicted in FIG. 2A, transceiver package 120A is offset from display 160 by spacing $S_2$, which is a function of package width $D_1$ and the paddle incline angle $\theta$. $S_2$ may be chosen to minimize in-active glass boarder width $W_B$ while ensuring inclined photonic chip(s) are sufficiently set off from display 160 to have an adequate solid angle of incidence.

Figure 3:
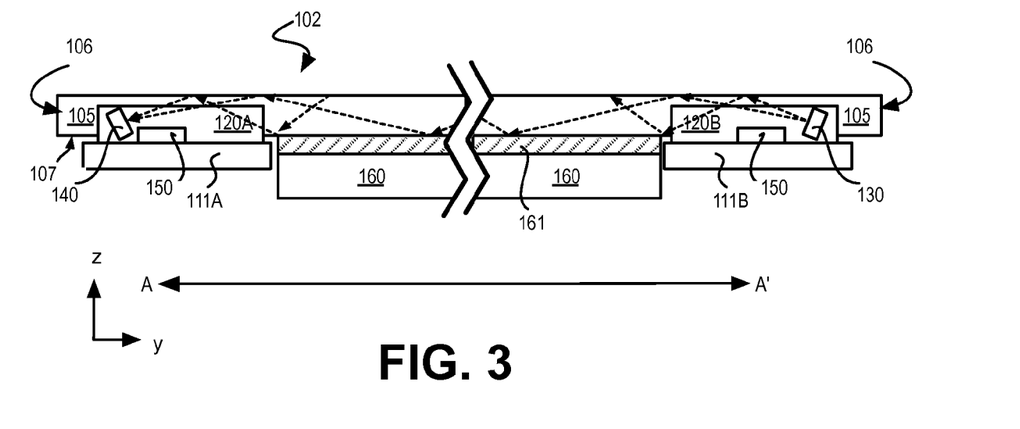
FIG. 3 illustrates a plurality of optical transceiver packages embedded into recesses within cover glass back surface, in accordance with an embodiment.

In a further embodiment, an optical touchscreen assembly includes a photonic chip package embedded into a back surface of the cover glass. FIG. 3A illustrates one such embodiment where an optical touchscreen assembly 102 includes plurality of optical transceiver packages 120A, 120B, substantially as described above, but embedded into recesses within cover glass back surface 107. For such an embodiment, cover glass 105 may have divots stamped, etched, or milled into cover glass back surface 107. In advantageous embodiments, cover glass back surface 107 at a bottom of the divot is flat and parallel to glass back surface 107 outside of the divot. Transceiver packages 120A, 120B, etc. in glass-embedded embodiments also have top surfaces substantially parallel with glass back surface 107. Lead frame paddles may therefore have the same incline angle $\theta$ described above for the non-glass-embedded embodiments. While embedding the photonic chip package within cover glass 105 has advantageously high efficiency (e.g., about 10% better than the exemplary non-glass-embedded embodiments illustrated in FIGS. 2A-2C), manufacturing costs are higher.

Figure 4A:
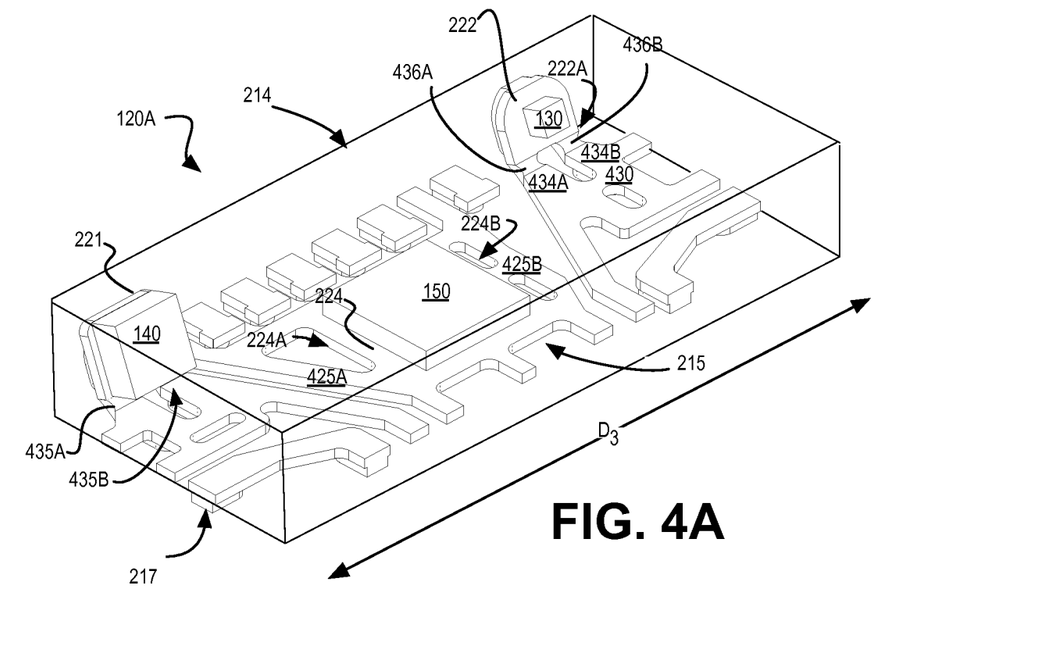
FIG. 4A is an isometric view of a photonic chip package, in accordance with an optical transceiver embodiment.

FIG. 4A is an isometric view of an inclined photonic chip package in accordance with an optical transceiver embodiment. Although illustrated for the exemplary MOS-optical transceiver package 120A, any photonic chip may be similarly packaged. Transceiver package 120A exemplifies an inclined paddle sawn no-lead (IPSN) package, and more particularly, an inclined paddle quad sawn no-lead (IPQSN) package. Transceiver package 120A is depicted in singulated-form prior to bonding to a PCB, for example as the package might appear as an input to a pick-n-place operation. Lead frame 215 includes inclined paddles 221, 222. Photo-emitter chip 130 is bonded to the die-attach surface of paddle 222 and photo-detector chip 140 is bonded to the die-attach surface of paddle 221. Each die-attach surface is therefore oriented non-parallel to contact pad bonding surface(s) 217. Encapsulant 214 surrounds the lead frame 215, inclined paddles 221, 222 and the photonic chips 130, 140, with package bonding surface(s) 217 extending beyond encapsulant 214. In the illustrated embodiment, edges of encapsulant 214 terminate at lead frame 215, allowing strip-form manufacturing. Package 120A further includes non-inclined paddle 224 having a die-attach surface that is substantially parallel to bonding surface(s) 217. CMOS chip 150 is attached to non-inclined paddle 224. As previously described, package length $D_3$ is a function of desired spacing between photo-emitter chip 130 and photo-detector chip 140. In an exemplary embodiment, $D_3$ is between 5 mm and 7 mm.

As further illustrated in FIG. 4A, inclined paddles 221, 222 are each a tab cantilevered from a remainder of the lead frame (i.e., the lead frame base) through one or more tie bar that has a smaller cross-sectional area than the paddle tab, and a smaller cross-sectional area than the adjoined base. The paddle tab structure is distinct from fully anchored paddle 224. Paddle 224 is non-cantilevered, having at least two opposite paddle edges 224A, 224B anchored by tie bars 425A, 425B. Inclined paddle 222 is however anchored to lead frame base 430 by a lead frame tie bar(s) at only one paddle edge 222A. Inclined paddle 221 is a similarly cantilevered tab structure.

In embodiments a lead frame paddle tab is cantilevered through at least a pair of tie bar having first tie bar ends coupled to a same edge of the paddle tab, and second tie bar ends coupled to the adjoined lead frame base. A pair of tie bars resists twisting of the paddle tab, although a wider single tie bar is a viable alternative. As shown in FIG. 4A, a pair of tie bars 434A, 434B are laterally spaced apart by a through hole in lead frame 215. Each tie bar 434A, 434B has a smaller cross-sectional area than paddle 222 and a smaller cross-sectional area than base 430. In advantageous embodiments, a paddle tab tie bar as includes a neck with a minimum cross-sectional area. In FIG. 4A for example, tie bar 434A has a neck 436A of smaller cross-sectional area than the remainder of the tie bar. Tie bar 434B has a neck 436B disposed approximately the same distance from paddle edge 222A as is neck 436A. Tie bar necks advantageously localize deformation of the lead frame for control of paddle tab deflection. A tie bar neck may be formed either through a reduction in lateral dimensioning, or through a reduction lead frame thickness (z-height), for example through a partial (one-sided etch) within the neck. In certain embodiments, one or more tie bars include a neck with both a smaller lateral dimension than the paddle and the base, and a lesser thickness than the paddle and the base.

Figure 4B:
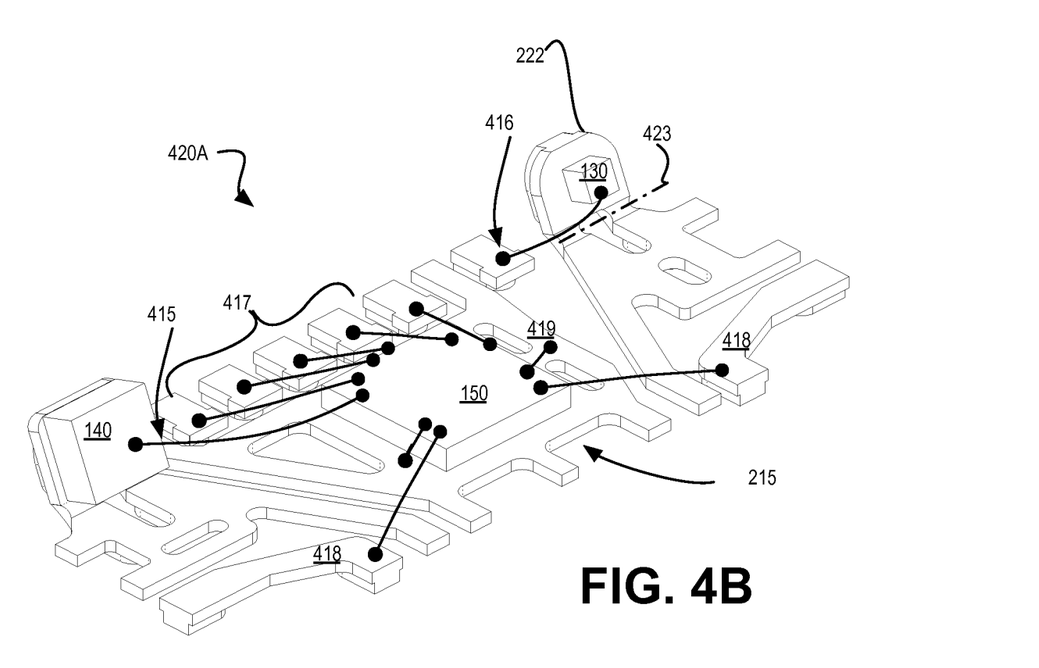
FIG. 4B is an isometric view of bond wires in a package lead frame assembly in accordance with an optical transceiver embodiment.

FIG. 4B is an isometric view of bond wires of a package lead frame assembly 420A, in accordance with an embodiment. Lead frame assembly 420A is illustrated without encapsulant 214 for clarity. Although not illustrated in FIG. 4B, in the depicted state lead frame assembly 420A may still be physically joined to other lead frames as part of a larger lead frame sheet. As illustrated, one or more bond wires electrically connect CMOS chip 150 directly to at least one of the photonic chips 130, 140, or the lead frame 215. In the exemplary embodiment, photo-detector chip 140 has a first terminal directly interconnected to CMOS chip 150 by wire bond 415 for good SNR. CMOS chip 150 is further coupled by wire bonds to a plurality of lead frame signal contact pads 417, as well as one or more lead frame power contact pads (e.g., VDD, VSS) 418, 419.

In advantageous embodiments, wire bonds coupled to an inclined chip extend predominantly in a direction substantially parallel to the deflection axis along which the lead frame paddle is inclined. For example, paddle deflection axis 423 is illustrated in FIG. 4B and wire bond 416 is nearly in alignment with axis 423. Having wire bond 416 extending to a contact pad that is adjacent to inclined paddle 222, rather than on the side of axis 423 opposite paddle 222, ensures sweep of bond wire 416 during paddle deflection is not significant and/or detrimental to operation of the packaged device.

Figures 5A, 5B, 5C:
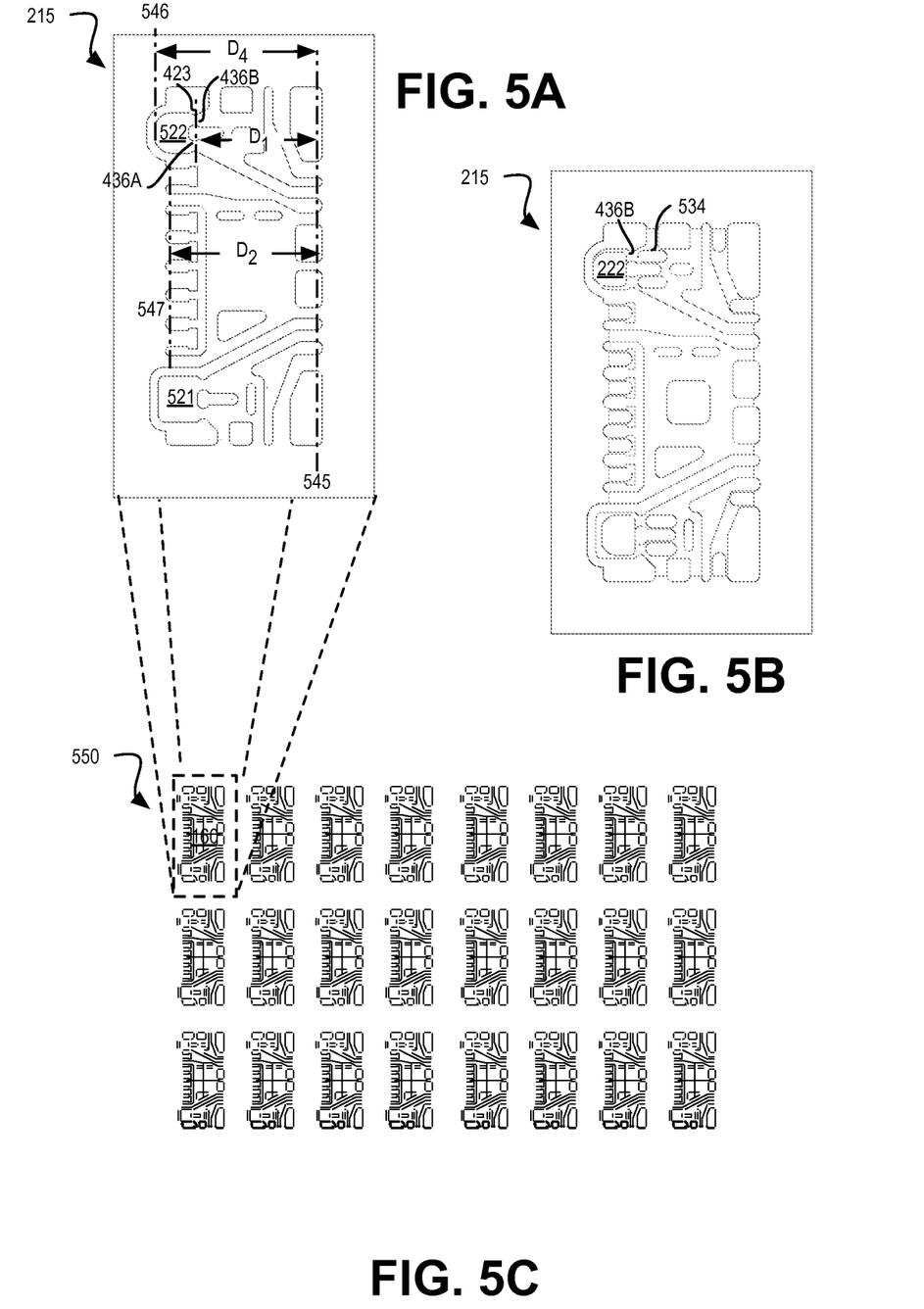
FIGS. 5A and 5B are plan views of a chip package lead frame, in accordance with optical transceiver embodiments.
FIG. 5C is a plan view of a lead frame sheet, in accordance with embodiments.

FIGS. 5A and 5B are plan views of lead frame 215, in accordance with optical transceiver embodiments. It is noted however that lead frame features described in the context of the exemplary optical transceiver embodiment may be readily adopted to many other photonic packaging applications. FIG. 5A illustrates through etch pattern for lead frame 215. The state illustrated in FIG. 5A is representative of a stage in the manufacture of lead frame 215 where lead frame 215 may be one unit within a sheet of lead frames 550, as illustrated in FIG. 5C. FIG. 5B is further illustrates regions of full and half lead frame thickness.

In FIG. 5A, paddle tabs 521, 522 are to be deflected to form inclined paddles 221, 222, respectively. Reduced lateral dimensions at necks 436A, 436B defining the paddle deflection axis 423 are illustrated in FIG. 5A. Notably, the lead frame has a maximum width $D_4$ extending from a free paddle tab edge to an opposite lead frame edge 545. The maximum width $D_4$ is significantly larger than width $D_2$ as a result of paddle tabs 521, 522 being positioned relative to lead frame edge 545 to maximize $D_1$, as was described above. The different lead frame widths $D_2$ and $D_4$ are atypical of a sawn package lead frame because one of the singulation lines 546 and 547 would be misaligned. Different lead frame widths $D_2$, $D_4$, along with the paddle tab structure (e.g., single-sided tie bar(s), necks 436A, 436B, etc.) are features indicative that a subsequent deformation operation is to be performed on lead frame 215 to deflect paddle tabs 521, 522 (e.g., into inclined paddles 221, 222).

In an embodiment, a paddle tab is cantilevered from the base through one or more tie bar that is anchored to a contact pad. Such anchoring may further ensure a form press can apply sufficient counter pressures between the ends of the tie bar to localize deformation of the lead frame to a desired location within the tie bar and achieve a predetermined paddle incline angle. In FIG. 5B for example, a contact pad 534 (e.g., $V_{ss}$ for a photo-emitter) is positioned at an end of tie bar opposite paddle tab 222. Full lead frame thicknesses within paddle tab 222 and contact pad(s) 534 further demark the reduced (e.g., one-half) lead frame thickness at tie bar neck 436B such that paddle tab 222 is supported by full thickness lead frame metal with a bridge across a neck to full thickness contact pad(s) 543.

Figure 6:
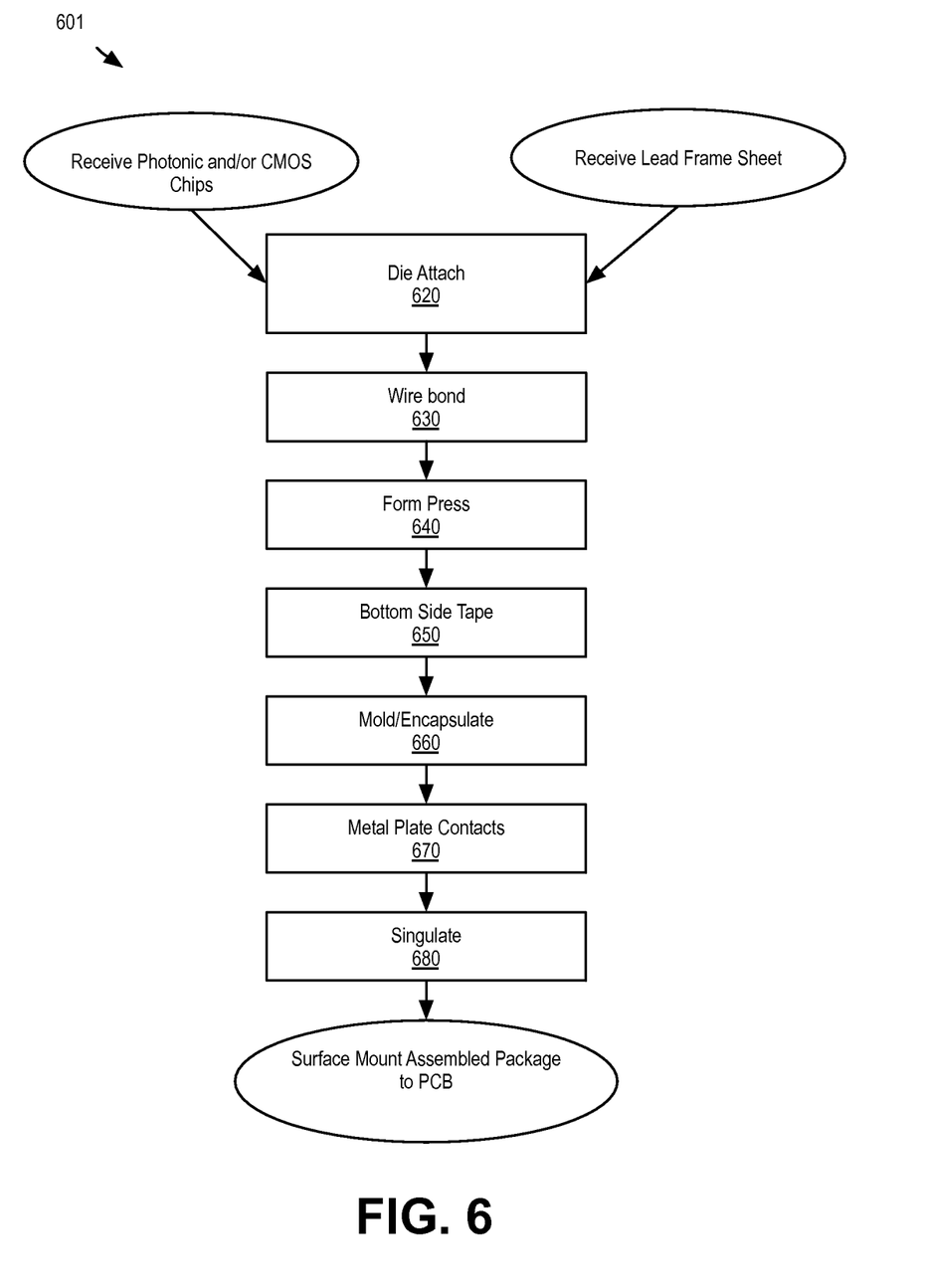
FIG. 6 is a flow diagram of a method for assembling a photonic chip package, in accordance with an embodiment.

FIG. 6 is a flow diagram of a method 601 for assembling a photonic chip package, in accordance with an embodiment. Method 601 begins with receiving a lead frame sheet, as well as one or more photonic chips and/or CMOS chips. Chips are then die-attached to lead frames at operation 620 using any conventional die-attach process. In a specific optical transceiver package embodiment, each of a photo-emitter chip, photo-detector chip and a CMOS chip are attached to lead frame paddles at operation 620. More specifically, a photo-emitter chip and photo-detector chip are each die-attached to a cantilevered paddle tab while a CMOS chip is die-attached to a non-cantilevered paddle. Method 601 continues with wire bonding at operation 630 where one or more wires are attached to one or more of the chips. Any wire bond process may be employed at operation 630, as embodiments herein are not limited in this respect. During die attach and wire bonding, the cantilevered paddle supported from bottom-side tooling.

Figure 8:
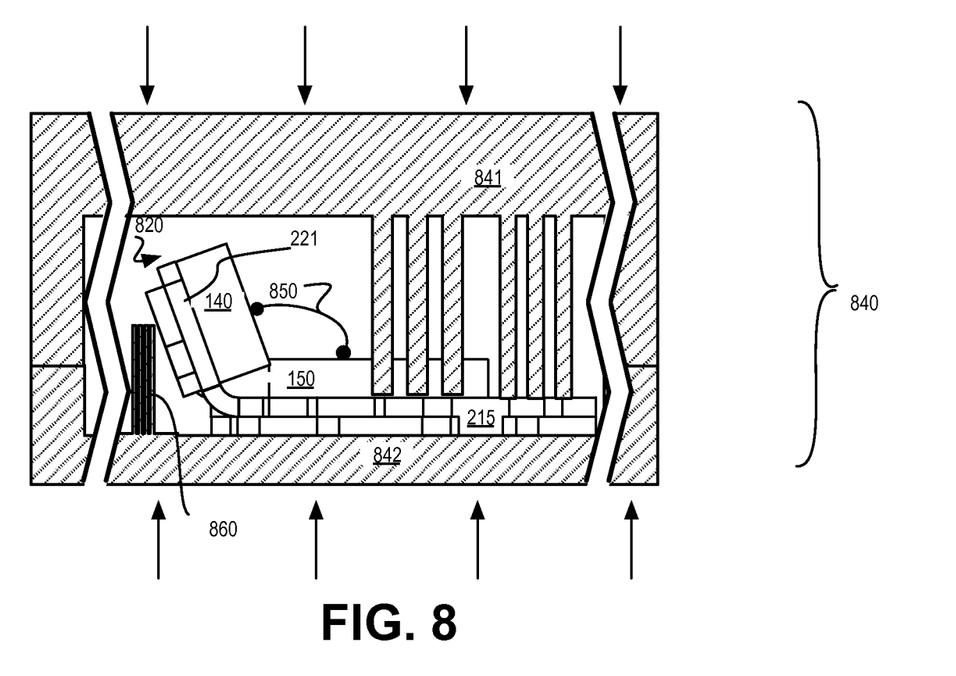
FIG. 8 is a cross-sectional view of an optical transceiver package lead frame assembly disposed in a forming press, in accordance with an embodiment.

At operation 640, the die-attached and wire bonded lead frame is form pressed to incline at least one lead frame paddle relative to a plating (or bonding) surface of one or more contact pad on the lead frame. Form pressing operation 640 is performed by applying a bracing pressure to a non-paddle portion of the lead frame with a first forming press die, or clamp, while applying an opposing pressure to a paddle tab with a second forming press die or clamp. FIG. 8 is a cross-sectional view of a transceiver package lead frame assembly 820 disposed in a forming press 840, in accordance with an embodiment. Forming press die 841 includes bosses to contact the top side of lead frame 215. Advantageously, there press die 841 makes contact only on lead frame bend features or peripheral regions outside of sawn lines in strip form with no contact on CMOS chip 150 or wirebond 850. Forming press die 841 includes clearance(s) within paddle tab portions of transceiver package lead frame assembly 820 and near wirebond(s) 850. Forming press die 842 makes contact with the bottom side of lead frame 215 and includes boss(es) 860 to contact a bottom side of the paddle tab(s). Applying pressure to the forming press dies 841,842 deflects the paddle tabs to form inclined paddles (e.g., inclined paddle 221). Form pressing operation 640 may concurrently form press multiple lead frame paddles. Large forming press dies may be utilized to concurrently press form multiple lead frame-based units. For example, a first forming press having a first plurality of bosses may be aligned with a first lead frame paddle of each lead frame in a lead frame sheet. A second forming press die having a second plurality of bossed may be aligned with a non-paddle region of each lead frame in the sheet.

With the package lead frame assembly now including inclined chips, package assembly method 601 continues to operation 650 where tape is applied to the bottom side of the lead frame. Any conventional backside taping process may be employed at operation 650. Method 601 then proceeds with molding operation 660 where any encapsulant suitable for the photonic chips is molded around the inclined chip(s), wirebond(s), CMOS chip(s), and lead frame. At operation 670, the bottom-side tape is removed and the exposed lead frame contact pads plated up using any conventional package plating process. A saw or punch singulation operation is then performed at operation 680 to separate individual packages, which may then be surface mounted or otherwise assembled one a PCB, etc.

Figure 7:
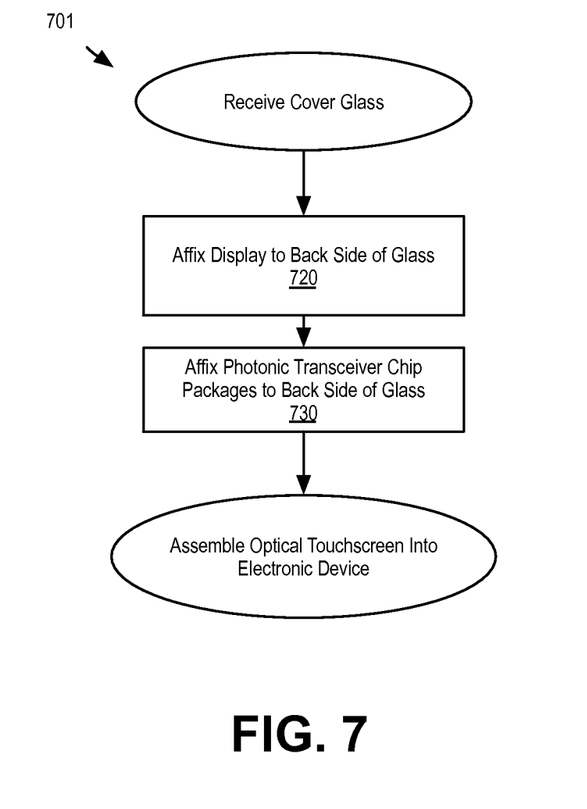
FIG. 7 is a flow diagram of a method for assembling an optical touchscreen, in accordance with an embodiment.

FIG. 7 is a flow diagram of a method 701 for assembling an optical touchscreen, in accordance with an embodiment. Method 701 begins with receiving a cover glass. At operation 720, a display is affixed to a back surface of the cover glass. Any conventional adhesive layer, etc. may be utilized at operation 720. Method 701 then continues with operation 730 where a plurality of optical transceiver chip packages are affixed to the back surface of the cover glass and adjacent to edges of the display (e.g., as illustrated in FIG. 2A). In the exemplary embodiment, the optical transceiver packages are each an integrated MOS-optical transceiver package (e.g., 120A in FIGS. 1 and 2A) including inclined photonic chips. Any number of such packages may be attached about the perimeter of the display, as a function of display/screen area. Prior to affixing the transceiver chip packages to the cover glass, contact pad surfaces of the packages may be first bonded (e.g., with surface mount technology) to one or more PCBs. Each optical transceiver chip package is affixed to the back surface of the glass with any conventional adhesive (e.g., silicone, etc.) or tape applied between the glass and at least one of the top package surface or the PCB so that the top package surface is substantially parallel with the side of the cover glass.

Figure 9:
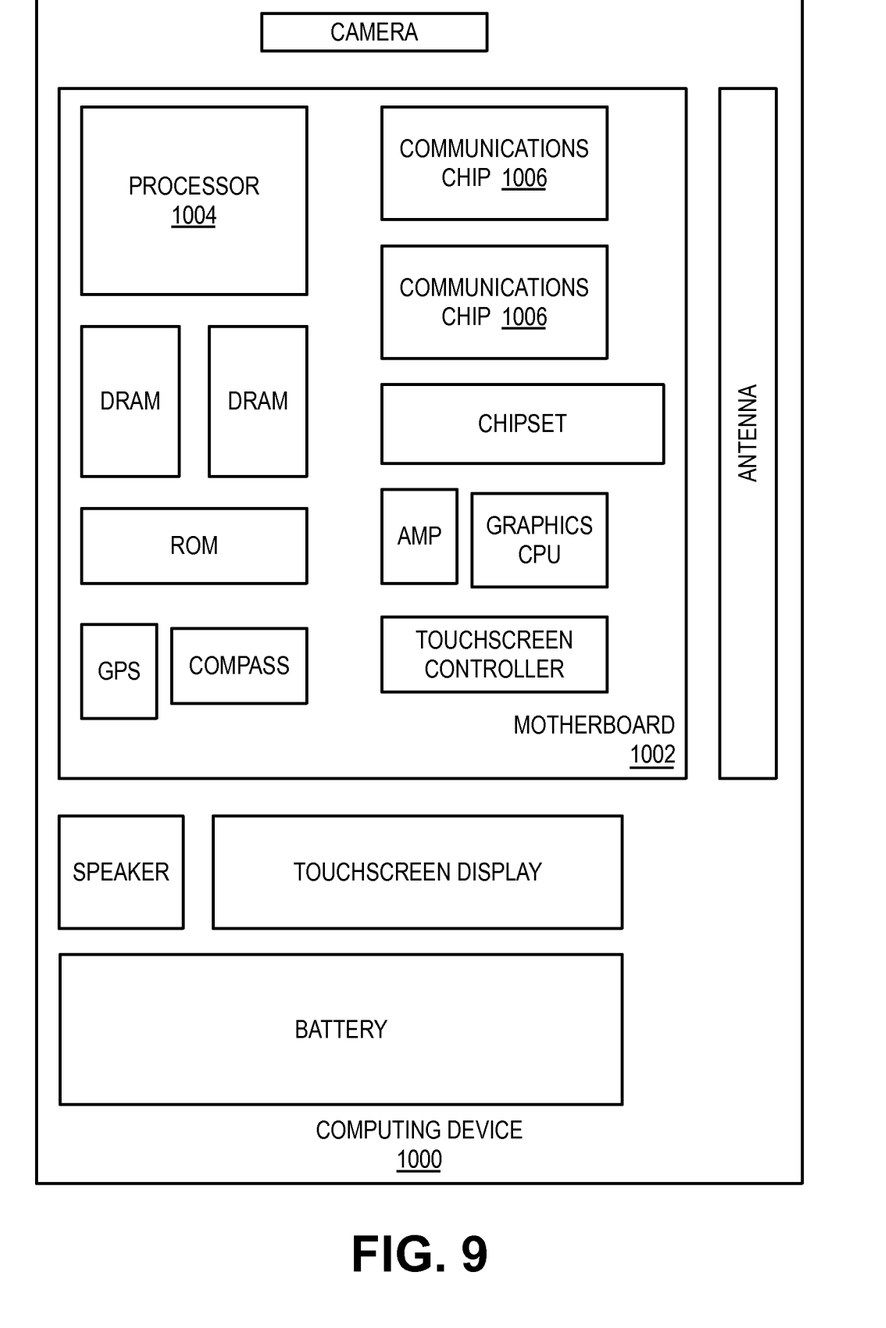
FIG. 9 is a functional block diagram of an electronic computing device, in accordance with an embodiment.

FIG. 9 is a functional block diagram of a computing device 1000, arranged in accordance with at least some implementations of the present disclosure. Computing device 1000 may be found inside platform 101 (FIG. 1), for example, and further includes a motherboard 1002 hosting a number of components, such as but not limited to a processor 1004 (e.g., an applications processor), which may incorporate optical touch screen technology as discussed herein, and at least one communication chip 1006. Processor 1004 may be physically and/or electrically coupled to motherboard 1002. In some examples, processor 1004 includes an integrated circuit die packaged within the processor 1004. In general, the term "processor" or "microprocessor" may refer to any device or portion of a device that processes electronic data from registers and/or memory to transform that electronic data into other electronic data that may be stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth), or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to particularly advantageous embodiments.

In one or more first embodiments, a chip package lead frame includes one or more tie bars and a paddle tab to support a chip. The paddle tab cantilevered from a remainder of the lead frame by the one or more tie bar. There is one or more contact pad to couple an electrical signal to and from the lead frame.

In furtherance of the one or more first embodiments, the one or more tie bar has a smaller cross-sectional area than the paddle tab.

In furtherance of the one or more first embodiments, the one or more tie bar has both a smaller lateral dimension than the paddle, and a smaller thickness than the paddle.

In furtherance of the one or more first embodiments, the paddle tab is cantilevered through at least a pair of tie bars having first tie bar ends coupled to a same edge of the paddle tab, and second tie bar ends coupled to the remainder of the lead frame. The tie bars are laterally spaced apart from each other by a through hole. Each of the tie bars has a smaller cross-sectional area than the paddle tab and an adjoined portion of the lead frame. A first of the tie bars has a first neck with a smaller cross-sectional area than a remainder of the first tie bar. A second of the tie bars has a second neck with a smaller cross-sectional area than a remainder of the second tie bar, wherein the first and second necks are disposed a same distance from the paddle tab edge.

In furtherance of the one or more first embodiments, the paddle tab is cantilevered through one or more tie bar having a first tie bar end coupled to the paddle tab, and a second tie bar end coupled to the remainder of the lead frame. At least one tie bar includes at least one of the one or more contact pad.

In furtherance of the one or more first embodiments, there is a second cantilevered paddle tab to support a second chip and a non-cantilevered paddle to support a third chip. The non-cantilevered paddle has at least two opposite paddle edges anchored by a tie bar. The non-cantilevered paddle is disposed between the first and second cantilevered paddle.

In one or more second embodiment, a photonic chip package includes a lead frame with an inclined paddle and a contact pad. The paddle has a first die-attach surface oriented non-parallel to a bonding surface of the contact pad. A first photonic chip is operative at a photonic wavelength and attached to the first die-attach surface. An encapsulant surrounds the lead frame, the inclined paddle and the first photonic chip, with the bonding surface extending beyond the encapsulant.

In furtherance of the one or more second embodiments, the first die-attach surface is oriented to between 65° and 85° from the bonding surface; and the first photonic chip comprises a detector sensitive to the wavelength.

In furtherance of the one or more second embodiments, the lead frame further includes a non-inclined paddle having die-attach surface substantially parallel to the bonding surface. The package further includes a CMOS chip attached to the non-inclined paddle. One or more bond wires electrically connect the CMOS chip directly to at least one of the first photonic chip, or the lead frame.

In furtherance of the one or more second embodiments, the lead frame further includes a second inclined paddle oriented non-parallel to the bonding surface. A third paddle is disposed between the first and second inclined paddles and having a third die-attach surface substantially parallel to the bonding surface. The package further includes a second photonic chip attached to the second inclined paddle. A CMOS chip is attached to the third paddle. One or more bond wires electrically connect the CMOS chip directly to one or more of the photonic chips, to the lead frame, or to both the lead frame and to one or more of the photonic chips.

In furtherance of the one or more second embodiments, the lead frame further includes a second inclined paddle oriented non-parallel to the bonding surface. A third paddle is disposed between the first and second inclined paddles. The package further includes a second chip attached to the second inclined paddle. A third chip is attached to the third paddle. The first chip is a photo-detector operative at a wavelength. The second chip is a photo-emitter operative at the wavelength. The third chip comprises at least one of: a CMOS photo-emitter driver, or a CMOS transimpedance amplifier (TIA), or a CMOS analog-to-digital convertor (ADC).

In furtherance of the one or more second embodiments, the lead frame further comprises a second inclined paddle oriented non-parallel to the bonding surface. A third paddle is disposed between the first and second inclined paddles. The package further includes a second chip attached to the second inclined paddle. A third chip is attached to the third paddle. A bond wire directly connects the first chip to the second chip. The first chip is a photo-detector operative at a wavelength. The second chip is an photo-emitter operative at the wavelength. The third chip comprises at least a CMOS transimpedance amplifier (TIA), CMOS analog-to-digital convertor (ADC), or both TIA and ADC.

In one or more third embodiments, a package includes the lead frame of the one or more first embodiments. The paddle tab is inclined to have a first die-attach surface oriented non-parallel to a bonding surface of the one or more contact pad. A first chip is attached to the first die-attach surface. An encapsulant surrounds the lead frame, the paddle tab and the first chip, with the bonding surface extending beyond the encapsulant.

In furtherance of the one or more third embodiments, the first die-attach surface is oriented to between 65° and 85° from the bonding surface.

In one four embodiments an optical touchscreen assembly includes a cover glass, and a display affixed to a first surface of the cover glass. A photonic chip package is adjacent to an edge of the display and has a package surface substantially parallel with the first surface of the cover glass. The photonic chip package includes at least one of a photo-emitter chip or photo-detector chip inclined relative to the first surface of the cover glass.

In furtherance of the one or more fourth embodiments, wherein the photonic chip package comprises a CMOS chip integrated with an optical transceiver further comprising a photo-emitter and a photo-detector, the CMOS chip further comprising at least one of a driver coupled to the photo-emitter, or a transimpedance amplifier (TIA) coupled to a photo-detector, or an analog-to-digital convertor (ADC) coupled to a photo-detector.

In furtherance of the one or more fourth embodiments, the device comprises a plurality of the photonic chip packages forming a perimeter about the display and each photonic package has a package surface substantially parallel with the first surface of the cover glass. Each of the photonic chip packages include a CMOS chip integrated with an optical transceiver further comprising a photo-emitter and a photo-detector, the CMOS chip further comprising at least one of: a driver coupled to the photo-emitter, transimpedance amplifier (TIA) coupled to a photo-detector, or an analog-to-digital convertor (ADC) coupled to the photo-detector.

In furtherance of the one or more fourth embodiments, the photonic chip package is embedded into the cover glass.

In one or more fifth embodiments, a method of assembling a photonic chip package includes attaching a first chip to a first lead frame paddle; form pressing the first lead frame paddle to incline the attached first chip relative to a surface of one or more contact pad on the lead frame; and forming an encapsulant around the inclined chip.

In furtherance of the one or more fifth embodiments, the method further includes bonding one or more wires to the first chip and the lead frame prior to the form pressing; applying a tape to the surface of the contact pad subsequent to the form pressing; and plating the surface of the contact after molding the encapsulant.

In furtherance of the one or more fifth embodiments, the method further includes attaching the first chip further comprises attaching a photo-emitter chip to the first paddle. The method further includes attaching a photo-detector chip to a second lead frame paddle; and form pressing the second lead frame paddle concurrently with the form pressing of the first lead frame paddle to incline the attached photo-detector chip relative to a surface of the one or more contact pad.

In furtherance of the one or more fifth embodiments, attaching the first chip further includes attaching a photo-emitter chip to the first lead frame paddle. The method further includes attaching a photo-detector chip to a second lead frame paddle; attaching a CMOS IC chip to a third lead frame paddle; and form pressing the second lead frame paddle concurrently with form pressing the first lead frame paddle to incline the attached photo-detector and photo-emitter chips relative to a surface of the one or more contact pad. The form pressing is performed while bracing the CMOS IC chip in a position substantially parallel to the surface of the one or more contact pad.

In furtherance of the one or more fifth embodiments, the form pressing further including applying a pressure to a non-paddle portion of the lead frame with a first forming press die and the method includes applying a counter pressure with a second forming press die to a surface of the first lead frame paddle opposite the attached first chip.

In furtherance of the one or more fifth embodiments, the form pressing further includes inserting a plurality of lead frames into a first forming press die; and applying a pressure to the plurality of lead frames with a second forming press die disposed on a surface of the plurality of lead frames opposite the first forming press die, wherein the first forming press die comprises a first plurality of bosses aligned with the first lead frame paddle of each lead frame and the second forming press die comprises second plurality of bossed aligned with a non-paddle region of each lead frame.

In one or more sixth embodiments, a method of fabricating an optical touchscreen includes receiving a cover glass, affixing a display to a back surface of a cover glass, and affixing a plurality of optical transceiver packages to the back surface of the cover glass and adjacent to edges of the display. Each transceiver package having a top package surface substantially parallel with the first surface of the cover glass, wherein the transceiver package includes both a photo-emitter chip and photo-detector chip inclined relative to the first surface of the cover glass.

In furtherance of the one or more sixth embodiments, the method includes surface mounting a contact pad surface of the one or more of the transceiver packages to a printed circuit board (PCB) prior to affixing the transceiver packages to the cover glass. The contact pad surface is disposed on a bottom surface of the transceiver package opposite the top package surface. Affixing the plurality of transceiver packages to the cover glass further includes applying an adhesive between the glass at least one of the top package surface or the PCB.

It will be recognized that embodiments of the invention are not limited to the exemplary embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. Scope should, therefore, be determined with reference to the appended claims, along with the full scope of equivalents to which such claims are entitled.

What is claimed is:

1. A method of assembling a photonic chip package, the method comprising:
    attaching a first chip to a first lead frame paddle of a lead frame;
    form pressing the first lead frame paddle relative to one or more contact pad on the lead frame to incline the attached first chip relative to a surface of the one or more contact pad; and
    forming an encapsulant around the inclined first chip.

2. The method of claim 1, wherein forming the encapsulant comprises molding an optically transmissive material around the inclined first chip.

3. The method of claim 1, wherein the first lead frame paddle is cantilevered from a remainder of the lead frame by one or more tie bar having a smaller cross-sectional area than the paddle.

4. The method of claim 3, wherein the form pressing deforms the one or more tie bar.

5. The method of claim 3, wherein the one or more tie bar has at least one of a smaller lateral dimension than the paddle, or a smaller thickness than the paddle.

6. The method of claim 1, further comprising;
    bonding one or more wires to the first chip and the lead frame prior to the form pressing.

7. The method of claim 1, further comprising:
    applying a tape to the surface of the contact pad subsequent to the form pressing;
    forming the encapsulant by molding while the contact pad is taped; and
    plating the surface of the contact pad after molding the encapsulant.

8. The method of claim 1, wherein:
    attaching the first chip further comprises attaching a photo-emitter chip to the first lead frame paddle.

9. The method of claim 8, wherein the method further comprises:
    attaching a photo-detector chip to a second lead frame paddle coupled to the lead frame; and
    form pressing the second lead frame paddle to incline the attached photo-detector chip relative to a surface of the one or more contact pad.

10. The method of claim 8, wherein the method further comprises:
    attaching a photo-detector chip to a second lead frame paddle;
    attaching a CMOS IC chip to a third lead frame paddle; and
    form pressing the second lead frame paddle to incline the attached photo-detector and photo-emitter chips relative to a surface of the one or more contact pad.

11. The method of claim 10, wherein the form pressing is performed while bracing the CMOS IC chip in a position substantially parallel to the surface of the one or more contact pad.

12. The method of claim 1, wherein the form pressing further comprises:
    applying a pressure to a non-paddle portion of the lead frame with a first forming press die; and
    applying a counter pressure with a second forming press die to a surface of the first lead frame paddle opposite the first chip.

13. The method of claim 1, wherein the form pressing further comprises:
  inserting a plurality of lead frames into a first forming press die; and
  applying a pressure to the plurality of lead frames with a second forming press die disposed on a surface of the plurality of lead frames opposite the first forming press die, wherein the first forming press die comprises a first plurality of bosses aligned with the first lead frame paddle of each lead frame and the second forming press die comprises second plurality of bosses aligned with a non-paddle region of each lead frame.

14. A method of fabricating an optical touchscreen, the method comprising:
  receiving a cover glass;
  affixing a display to a first surface of a cover glass; and
  affixing a plurality of optical transceiver packages to the first surface of the cover glass and adjacent to edges of the display, wherein each of the transceiver packages has a top package surface substantially parallel with the first surface of the cover glass, and wherein each of the transceiver packages includes both a photo-emitter chip and photo-detector chip inclined relative to the first surface of the cover glass.

15. The method of claim 14, wherein the top package surface comprises an optically transmissive encapsulant surrounding the photo-emitter chip or photo-detector chip.

16. The method of claim 14, further comprising:
  surface mounting a contact pad surface of the one or more transceiver packages to a printed circuit board (PCB) prior to affixing the transceiver packages to the cover glass, the contact pad surface disposed on a bottom surface of the transceiver package opposite the top package surface.

17. The method of claim 16, wherein affixing the plurality of transceiver packages to the cover glass further comprises applying an adhesive between the cover glass and at least one of the top package surface or the PCB.

18. A method of assembling an electronic device, the method comprising:
  receiving an optical touchscreen including:
    a cover glass;
    a display affixed to a first surface of the cover glass; and
    a photonic chip package adjacent to an edge of the display and having a package surface substantially parallel with the first surface of the cover glass, wherein the photonic chip package includes at least one of a photo-emitter chip or photo-detector chip inclined relative to the first surface of the cover glass; and
  assembling the optical touchscreen into an electronic device.

19. The method of claim 18, wherein the electronic device further includes:
  one or more processors;
  one or more wireless communication chips;
  a memory coupled to at least one of the processors and communication chips; and
  one or more battery.

20. The method of claim 19, wherein the at least one wireless communication chip implements a wireless protocol selected from the group consisting of: CDMA and LTE.

* * * * *